(12) United States Patent
McKenzie et al.

(10) Patent No.: US 7,486,074 B2
(45) Date of Patent: Feb. 3, 2009

(54) SELF-CALIBRATION METHODS FOR PARALLEL IMAGING AND MULTIPOINT WATER-FAT SEPARATION METHODS

(75) Inventors: Charles A. McKenzie, London (CA); Anja Brau, Menlo Park, CA (US); Huanzhou Yu, Mountain View, CA (US); Scott B. Reeder, Middleton, WI (US); Jean H. Brittain, Middleton, WI (US); Ann Shimakawa, Palo Alto, CA (US)

(73) Assignees: The Board of Trustees of the Leland Stanford Junior University, Palo Alto, CA (US); General Electric Company, Schenectady, NY (US)

( * ) Notice: Subject to any disclaimer, the term of this patent is extended or adjusted under 35 U.S.C. 154(b) by 94 days.

(21) Appl. No.: 11/738,340

(22) Filed: Apr. 20, 2007

(65) Prior Publication Data

US 2008/0012565 A1    Jan. 17, 2008

Related U.S. Application Data (60) Provisional application No. 60/745,602, filed on Apr. 25, 2006.

(51) Int. Cl.
*G01V 3/00*    (2006.01)
(52) U.S. Cl. .................................... 324/309; 324/307
(58) Field of Classification Search ................. 324/309, 324/307
See application file for complete search history.

(56) References Cited

U.S. PATENT DOCUMENTS 5,910,728 A    6/1999    Sodickson
6,289,232 B1    9/2001    Jakob et al.
6,377,045 B1    4/2002    Van Den Brink et al.
6,605,943 B1    8/2003    Clark et al.
6,714,010 B2    3/2004    Madore
6,836,114 B2    12/2004    Reddy et al.
6,903,551 B2 *    6/2005    Madore ...................... 324/309
7,298,144 B2    11/2007    Reeder et al.
7,332,909 B2 *    2/2008    Schaffter et al. ............ 324/309
7,349,729 B2    3/2008    Reeder et al.
7,394,252 B1 *    7/2008    Lin ............................ 324/309
7,397,242 B2 *    7/2008    Samsonov et al. .......... 324/309
7,418,287 B2 *    8/2008    Tsao et al. .................. 600/410

OTHER PUBLICATIONS

Office Action dated May 28, 2008 from U.S. Appl. No. 11/738,350.
Office Action dated Jun. 18, 2008 from U.S. Appl. No. 11/738,345.

(Continued)

*Primary Examiner*—Louis M Arana
(74) *Attorney, Agent, or Firm*—Beyer Law Group LLP (57) ABSTRACT

A method for generating a self-calibrating parallel multiecho magnetic resonance image is provided. A magnetic resonance imaging excitation is applied. A first echo at a first echo time in a first pattern is acquired. A second echo at a second echo time different from the first echo phase in a second pattern different from the first pattern is acquired. The acquired first echo and acquired second echo are used to generate an image in an image pattern, wherein none of the acquired echoes for generating the image have the same pattern as the image pattern.

20 Claims, 6 Drawing Sheets

OTHER PUBLICATIONS

An et al., "Chemical Shift Imaging with Spectrum Modeling", Magn. Reson. Med. (2001) 46(1):126-130.

An et al., "Water-Fat Imaging with Three Orthogonal-Phase Acquisitions", Proceedings 6th Scientific Meeting, International Society for Magnetic Resonance in Medicine (1998), 1866.

Brau et al., "Accelerated Ideal Water-Fat Separation Techniques for Single- and Multi-Coil Applications", Proc. Intl. Soc. Mag. Reson. Med. 13 (2005) p. 491.

Bydder et al., "Fat Quantification by Modeling the Varation in Signal Amplitude with TE", Proc. Intl. Soc. Mag. Reson. Med. 14 (2006) p. 2298.

Dixon, "Simple Proton Spectroscopic Imaging", Radiology (1984) 153:189-194.

Fernandez-Real et al., "Cross-Talk between Iron Metabolism and Diabetes", Diabetes (2002), 51(8):2348-2354.

George et al., "Increased Hepatic Iron Concentration in Nonalcoholic Steatohepatitis is Associated with Increased Fibrosis", Gasatroenterology (1998), 114(2):311-318.

Glover, G., "Multipoint Dixon Technique for Water and Fat Proton and Susceptibility Imaging", Journal of Magnetic Resonance Imaging (1991), 1:521-530.

McKenzie et al., "Abdominal Three Point Dixon Imaging with Self Calibrating Parallel MRI", in Proc. Intl. Soc. Mag. Reson. Med. 11 (2004), p. 917.

Moirand et al., "A New Syndrome of Liver Iron Overload with Normal Transferin Saturation", The Lancet (1997); 349 (9045):95-97.

Pineda et al., "Cramer-Rao Bounds for Three-Point Decomposition of Water and Fat", Magn. Reson. Med. (2005) 54(3):625-635.

Reeder et al., "Iterative Decomposition of Water and Fat with Echo Asymmetry and Least-Squares Estimation (Ideal): Application with Fast Spin-Echo Imaging", Magn. Reson. Med. (2005), 54(3):636-644.

Reeder et al., "Multicoil Dixon Chemical Species Separation with an Iterative Least-Squares Estimation Method", Magn. Reson. Med. (2004) 51:35-45.

Westphalen et al., "Liver Fat: Effect of Hepatic Iron Deposition on Evaluation with Opposed-Phase MR Imaging", Radiology (2007), 242(2):450-455.

Wieben et al., "Multi-Echo Balanced SSFP Imaging for Iterative Dixon Reconstruction", Proc. Intl. Soc. Mag. Reson. Med. 13 (2005), p. 2386.

Yu et al., "Field Map Estimation with a Region Growing Scheme for Iterative 3-Point Water-Fat Decomposition", Magn. Reson. Med. (2005) 54(3):1032-1039.

Yu et al., "Single Acquisition Water-Fat Separation: Feasibility Study for Dynamic Imaging", Magn. Reson. Med. (2006) 55(2): 413-422.

Yu et al., "Single Quadrature Echo Water-Fat Separation with Robust Phase Correction", Proc. Intl. Soc. Mag. Reson. Med. 14 (2006), p. 2446.

U.S. Appl. No. 10/690,230, by Reeder et al. entitled "Magnetic Resonance Imaging of Different Chemical Species in a System Having Magnetic Field Heterogeneities", filed on Oct. 23, 2003 (published).

* cited by examiner

SELF-CALIBRATION METHODS FOR PARALLEL IMAGING AND MULTIPOINT WATER-FAT SEPARATION METHODS

CROSS REFERENCE TO RELATED APPLICATIONS

This application claims priority under 35 U.S.C. §119 from U.S. Provisional Patent Application No. 60/745,602, filed Apr. 25, 2006, entitled MRI METHODS FOR COMBINING SEPARATE SPECIES AND QUANTIFYING A SPECIES which is incorporated herein by reference for all purposes.

GOVERNMENT RIGHTS

The U.S. government has rights in the disclosed invention pursuant to NIH Grant No. P41RR09784 to Stanford University.

BACKGROUND OF THE INVENTION

This invention relates generally to magnetic resonance imaging of an object, and more particularly the invention relates to species imaging in the presence of magnetic field heterogeneity.

Reliable and uniform fat suppression is essential for accurate diagnoses in many areas of MRI. This is particularly true for sequences such as fast spin-echo (FSE), steady-state free precession (SSFP) and gradient echo (GRE) imaging, in which fat is bright and may obscure underline pathology. Although conventional fat saturation may be adequate for areas of the body with relative homogeneous $B_o$ field, there may be many applications in which fat saturation routinely fails. This is particularly true for extremity imaging, off-isocenter imaging, large field of view (FOV) imaging, and challenging areas such as the brachial plexus and skull based, as well as many others. Short-TI inversion recovery (STIR) imaging provides uniform fat suppression, but at a cost of reduced signal-to-noise ratio (SNR) and mixed contrast that is dependent on $T_1$. This latter disadvantage limits STIR imaging to $T_2$ weighted ($T_2W$) applications, such that current $T_1$ weighted ($T_1W$) applications rely solely on conventional fat-saturation methods. Another fat suppression technique is the use of spectral-spatial or water selective pulses; however, this method is also sensitive to field inhomogeneities.

"In and Out of Phase" Imaging was first described by Dixon in "Simple Proton Spectroscopic Imaging", Radiology (1984) 153:189-194, and was used to exploit the difference in chemical shifts between water and fat and in order to separate water and fat into separate images. Glover et al. further refined this approach, described in Glover G., "Multipoint Dixon Technique for Water and Fat Proton and Susceptibility Imaging", Journal of Magnetic Resonance Imaging (1991) 1:521-530, with a 3-point method that accounts for magnetic field inhomogeneities created by susceptibility differences. This method was applied with FSE imaging by acquiring three images with the readout centered at the spin-echo for one image and symmetrically before and after the spin-echo in the subsequent two images.

In parallel MRI techniques may be used to increase imaging speed. Such techniques are described in U.S. Pat. No. 5,910,728 issued Jun. 8, 1999 to Sodickson, U.S. Pat. No. 6,289,232 issued Sep. 11, 2001 to Jakob et al., and U.S. Pat. No. 6,714,010 issued Mar. 30, 2004 to Madore et al.

SUMMARY OF THE INVENTION

To achieve the foregoing and in accordance with the purpose of the present invention, a method for generating a self-calibrating parallel multiecho magnetic resonance image is provided. A magnetic resonance imaging excitation is applied. A first echo at a first echo time in a first sampling pattern is acquired. An additional echo(s) at an additional echo time(s) different from the first echo in an additional sampling pattern(s) different from the first sampling pattern is acquired. The acquired first echo and acquired additional echo(s) are used to generate images in image sampling patterns, wherein none of the acquired echoes for generating the images have the same pattern as the image sampling pattern.

In another manifestation of the invention a method for generating a dynamic image comprising a plurality of self-calibrating parallel multiecho magnetic resonance images is provided. A phase demodulation and an image is provided comprising applying a magnetic resonance imaging excitation, acquiring a first echo at a first echo time in a first sampling pattern, acquiring a second echo at a second echo time different from the first echo in a second sampling pattern different from the first sampling pattern, acquiring a third echo at a third echo time different from the first echo time and the second echo time in a third sampling pattern, and using the acquired first echo, the acquired second echo, and the acquired third echo to provide a phase demodulation. For plurality of cycles images are provided, where each cycle comprises acquiring a single echo in the third sampling pattern and using the acquired single echo and the phase demodulation to generate an image, wherein the third sampling pattern is different from the image sampling pattern.

In another manifestation of the invention, an apparatus for providing magnetic resonance images is provided. A magnet system is provided. A controller is electrically connected to the magnet system and comprises a display, at least one processor, and computer readable media. The computer readable media comprises computer readable code for applying a magnetic resonance imaging excitation through the magnet system, computer readable code for acquiring a first echo at a first echo time in a first sampling pattern, computer readable code for acquiring a second echo at a second echo time different from the first echo in a second sampling pattern different from the first sampling pattern, and computer readable code for using the acquired first echo and acquired second echo to generate an image in a sampling pattern, wherein none of the acquired echoes for generating the image have the same sampling pattern as the image sampling pattern, which is displayed on the display.

The invention, objects, and features thereof will be more readily apparent from the following detailed description and appended claims when taken with the drawings.

DETAILED DESCRIPTION OF ILLUSTRATED EMBODIMENTS

Parallel MRI reconstructions require knowledge of spatial sensitivity information for the coil array. The most common solution to the problem of coil sensitivity calibration has been to measure sensitivities directly using one or more fully gradient encoded calibration images. For abdominal imaging in particular, this introduces a possible source of error, as it is difficult to ensure that the patient and coil will be in exactly the same positions during both the calibration scans and the accelerated data acquisitions. Previous work on combining parallel imaging and the Dixon reconstruction has been done outside the abdomen, thus avoiding this calibration issue.

C. A. McKenzie in "Abdominal Three Point Dixon Imaging with Self Calibrating Parallel MRI," in Proc. Intl. Soc. Mag. Reson. Med. 11 (2004), pg. 917, avoids the sensitivity calibration problem by accelerating two of the three Dixon images while acquiring the third with full gradient encoding. The necessary calibration information was extracted from a fully gradient encoded image. This guarantees correct measurement of the coil sensitivities, since the data to be reconstructed and the sensitivity data will be acquired simultaneously.

Figure 1:
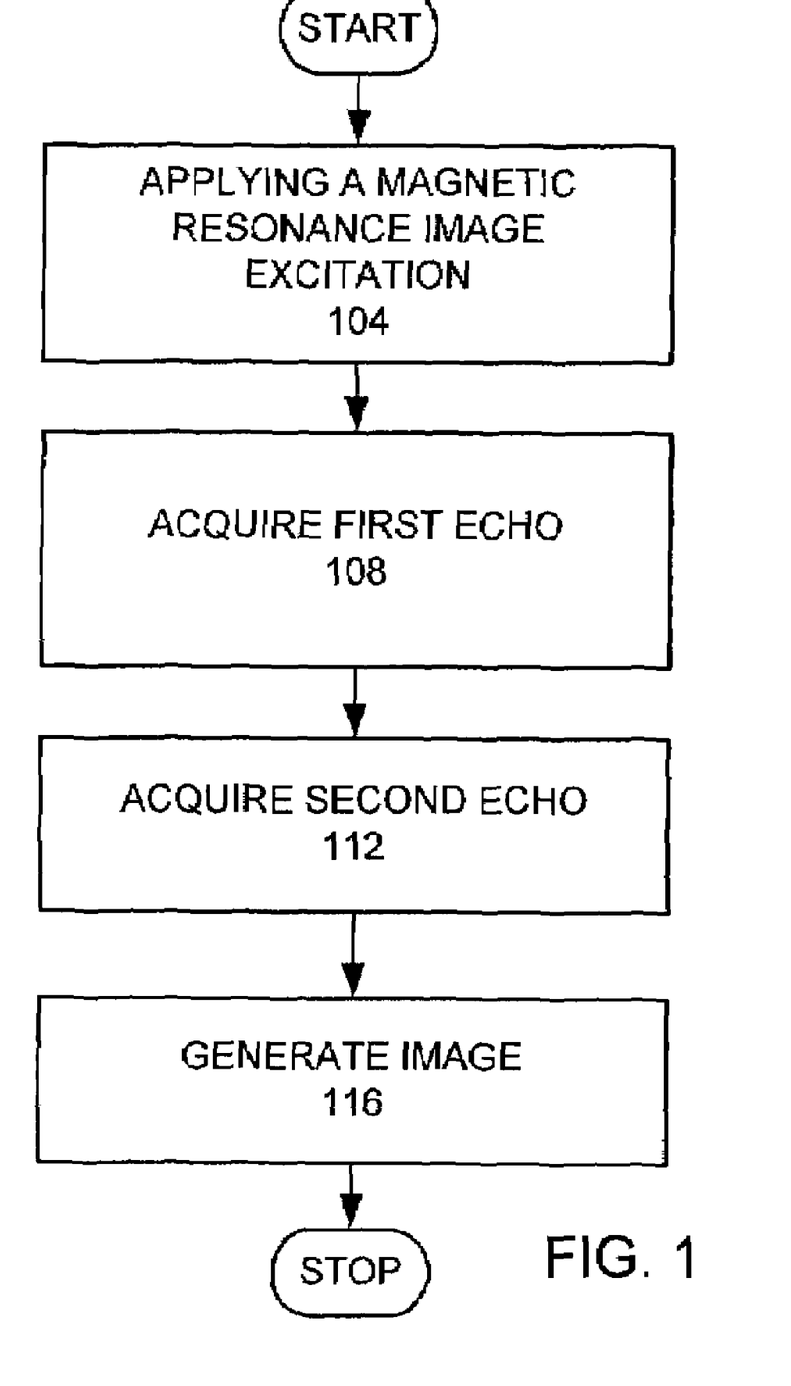
FIG. 1 is a high level flow chart of an embodiment of the invention.

FIG. 1 is a high level flow chart of an embodiment of the invention. At least one magnetic resonance image excitation is applied (step 104). A first echo is acquired (step 108). The first echo has a first sampling pattern. In one example, factors that may be used for defining a sampling pattern may be the resolution of the sampling pattern and whether the sampling pattern is under sampled or fully sampled. A fully sampled pattern would be a pattern with line spacing dense enough to create a full field of view image or a full calibration map, where an under sampled pattern would be insufficient to generate full field of view image or a full calibration map. A second echo is acquired (step 112). The second echo has a second sampling pattern different from the first sampling pattern. The sampling patterns of the first and second echoes are used to create an image with a sampling pattern that is different from the first and second sampling patterns (step 116).

Sampling patterns may be different in the number of lines acquired. For example, one sampling pattern may have 32 lines and another sampling pattern may have 128 lines. Different sampling patterns may have the same number of lines but still be different patterns. For example, one sampling pattern may have 128 lines evenly spaced, where another sampling pattern may have 128 lines, where near the center of the sampling lines are closely bunched together and near the sides of the image lines are more spread out.

Figure 2:
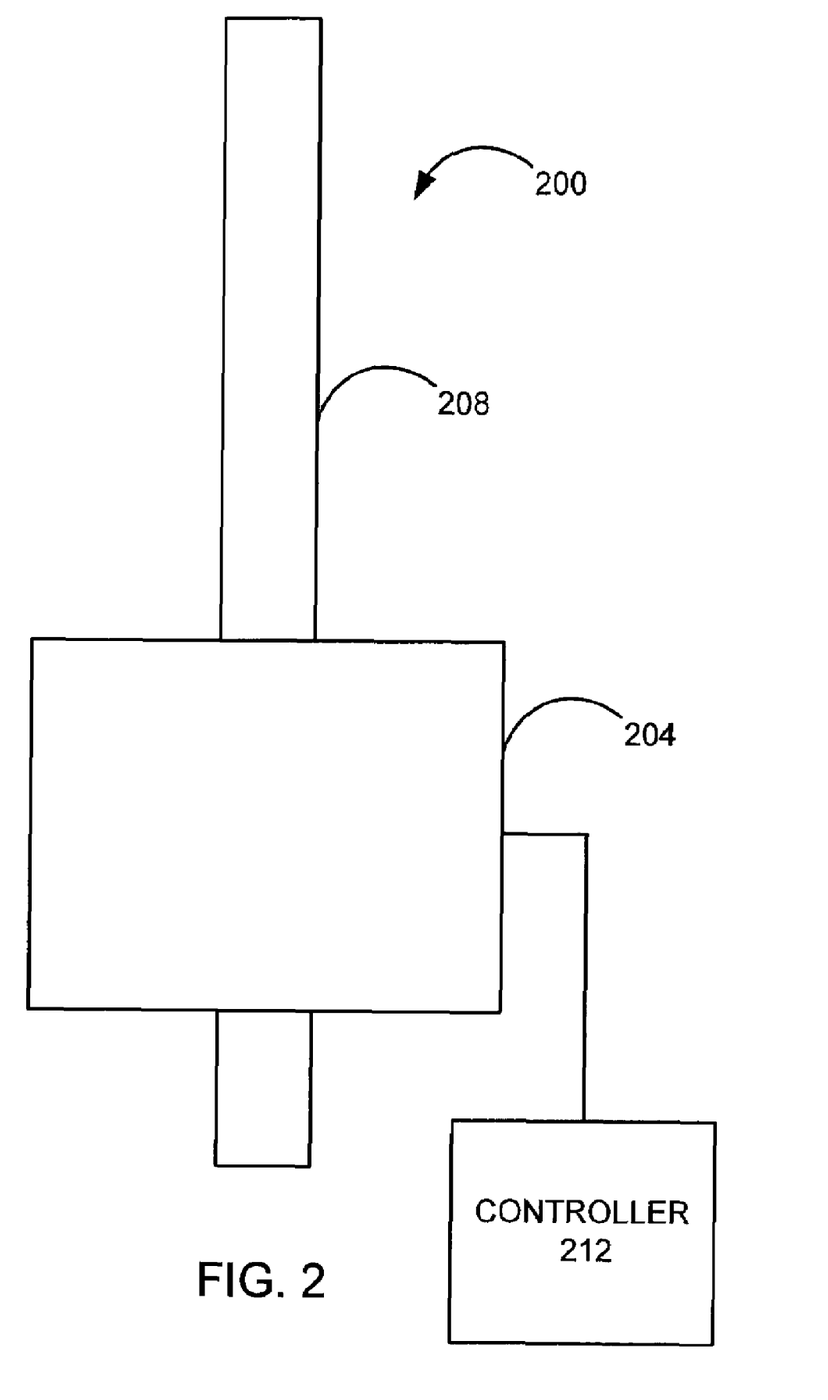
FIG. 2 is a schematic top view of a magnetic resonance imaging (MRI) system 200 that may be used in an embodiment of the invention.

FIG. 2 is a schematic top view of a magnetic resonance imaging (MRI) system 200 that may be used in an embodiment of the invention. The MRI system 200 comprises a magnet system 204, a patient transport table 208 connected to the magnet system, and a controller 212 controllably connected to the magnet system. In one example, a patient would lie on the patient transport table 208 and the magnet system 204 would pass around the patient. The controller 212 would control magnetic fields and radio frequency (RF) signals provided by the magnet system 204 and would receive signals from detectors in the magnet system 204.

Figure 3A:
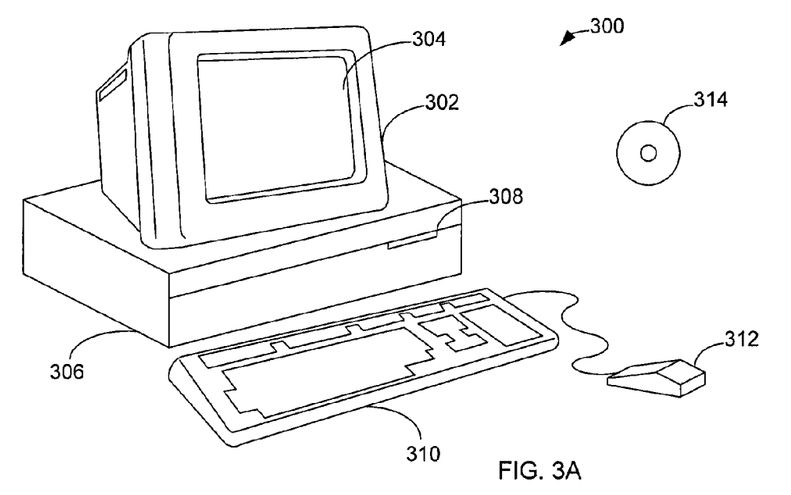
FIGS. 3A and 3B illustrate a computer system, which is suitable for implementing a controller 212 used in embodiments of the present invention.
Figure 3B:
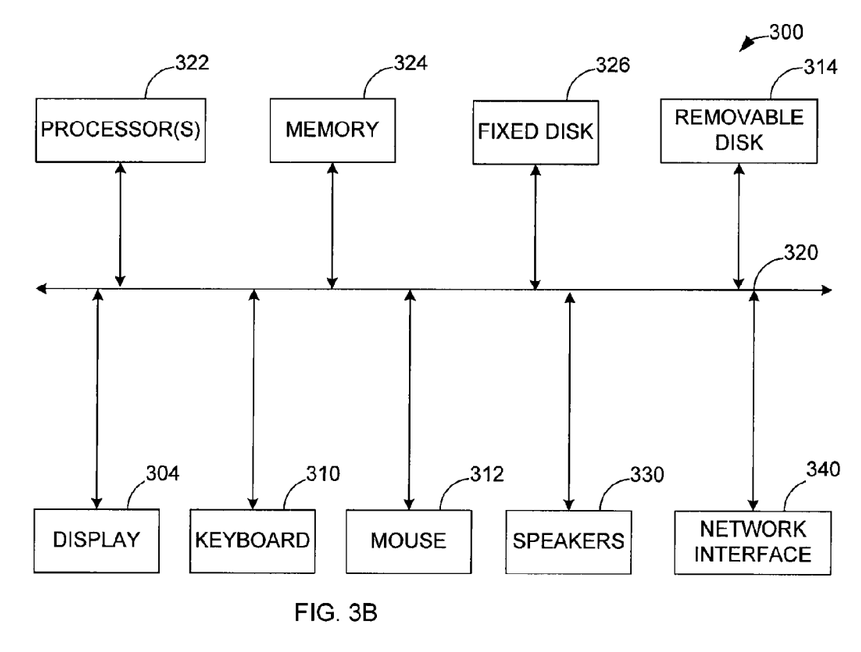

FIGS. 3A and 3B illustrate a computer system 300, which is suitable for implementing a controller 212 used in embodiments of the present invention. FIG. 3A shows one possible physical form of the computer system. Of course, the computer system may have many physical forms ranging from an integrated circuit, a printed circuit board, and a small hand-held device up to a huge super computer. Computer system 300 includes a monitor 302, a display 304, a housing 306, a disk drive 308, a keyboard 310, and a mouse 312. Disk 314 is a computer-readable medium used to transfer data to and from computer system 300.

FIG. 3B is an example of a block diagram for computer system 300. Attached to system bus 320 are a wide variety of subsystems. Processor(s) 322 (also referred to as central processing units, or CPUs) are coupled to storage devices, including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than primary storage. It will be appreciated that the information retained within fixed disk 326 may, in appropriate cases, be incorporated in standard fashion as virtual memory in memory 324. Removable disk 314 may take the form of the computer-readable media described below.

CPU 322 is also coupled to a variety of input/output devices, such as display 304, keyboard 310, mouse 312, and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

EXAMPLES

2⁺ Point Process

Reduced sampling techniques can be used to shorten IDEAL acquisition time by reducing the amount of required data to be collected. In the "2⁺-point" method, the $B_0$ field is assumed to vary slowly across the object. This assumption permits a reduced sampling scheme whereby one of the three IDEAL source images can be acquired with significantly lower spatial resolution than the other two images. All three low-pass filtered images contribute to field map estimation, but water-fat decomposition is performed only on the two high-resolution source images. This modification effectively reduces the IDEAL technique from a 3-point method to a 2⁺-point method, where the "⁺" refers to the small amount of data acquired in the low-resolution source image. The reduction in scan time is therefore proportional to the amount of data omitted from the low-resolution source image—30% scan time reductions are typical.

Figure 4:
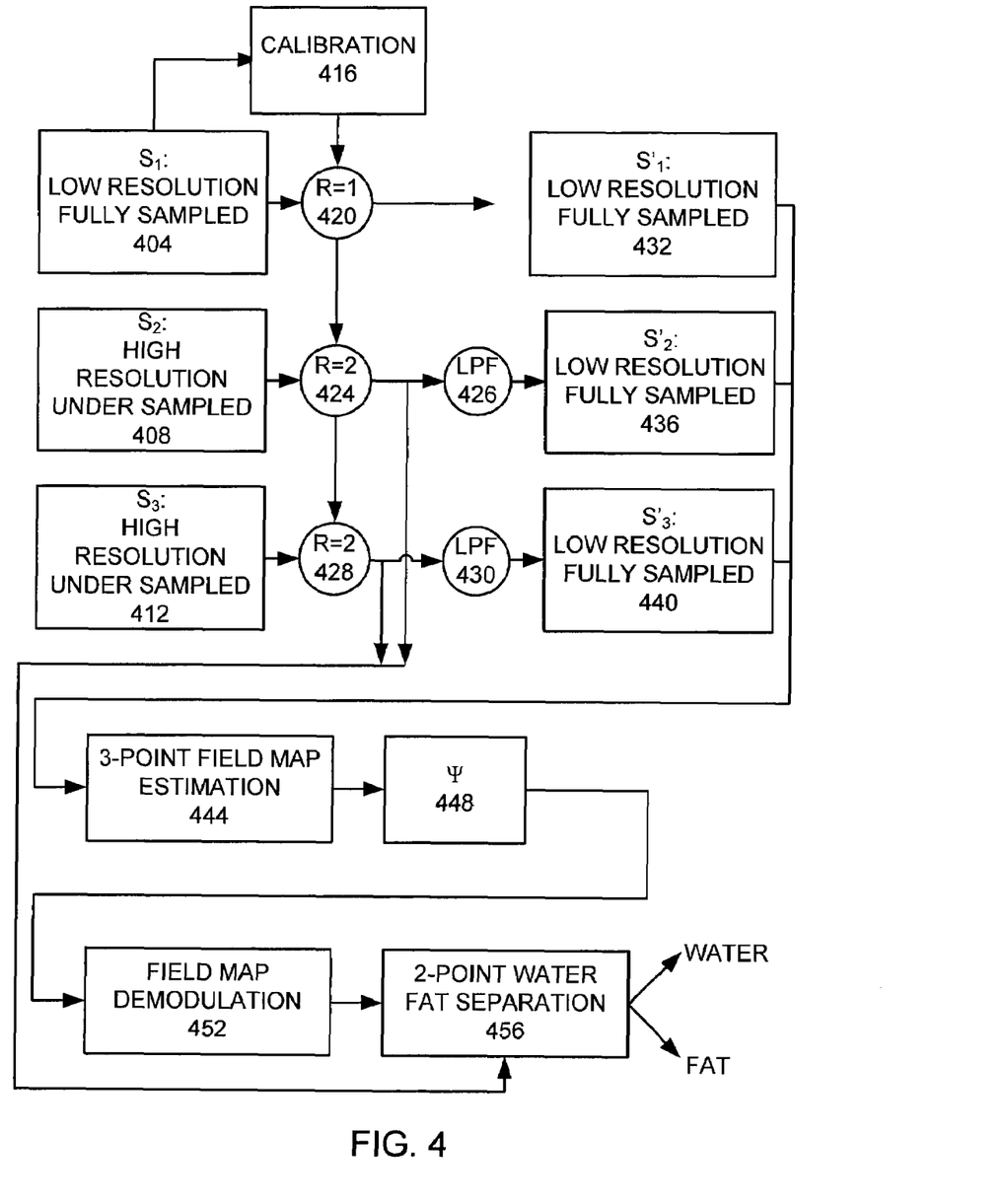
FIG. 4 is a flow chart illustrating a $2^+$ point example.

Self-calibrated parallel imaging can also be combined with the 2⁺-point reduced sampling technique to achieve even greater scan time reductions. FIG. 4 is a flow chart illustrating this example. The two high-resolution echo sample patterns $S_2$ and $S_3$ 408, 412 can be under-sampled using parallel imaging, while the low-resolution echo sample pattern $S_1$ 404 is fully sampled. In this example, the low resolution $S_1$ has a pattern of 32 lines. $S_2$ and $S_3$ are high resolution, under sampled patterns of 128 lines. In this example, $S_2$ and $S_3$ have the same sampling patterns. As defined, the low resolution pattern has less data than the high resolution pattern.

Figure 5A:
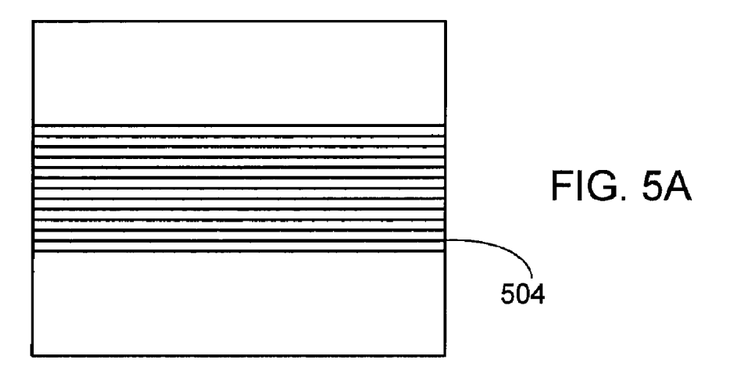
FIGS. 5A-C schematically illustrate different sampling patterns.
Figure 5B:
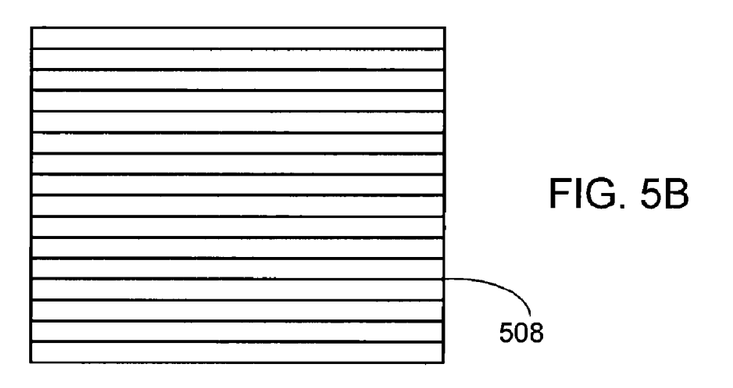
Figure 5C:
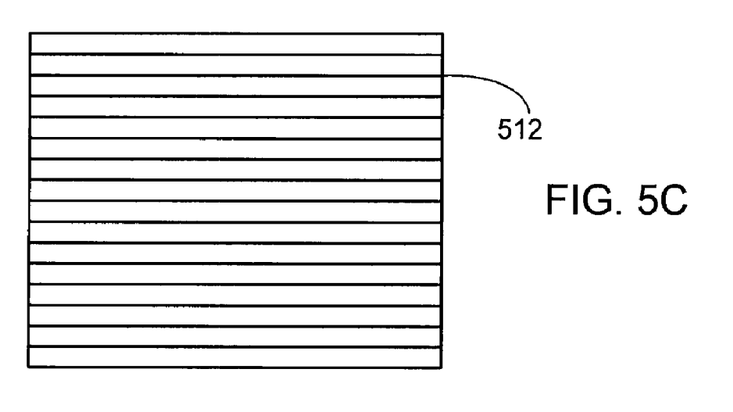

FIGS. 5A-C schematically illustrate a low resolution fully sampled sampling pattern 504 for $S_1$ (FIG. 5A) and high resolution, under sampled sampling patterns 508, 512 for $S_2$ (FIG. 5B) and $S_3$ (FIG. 5C). It should be noted that the low resolution sampling pattern 504 samples only part of the space, so that the high resolution sampling patterns 508, 512 sample a more extended area than the low resolution sampling pattern 504. In this example, the low resolution sampling pattern 504 is fully sampled and the high resolution sampling patterns are under sampled, so that in the lines in the low resolution sampling pattern 504 are denser than the lines in the high resolution sampling patterns 508, 512.

The fully sampled echo $S_1$ can be used in a self-calibrated manner as the coil sensitivity data needed for parallel imaging reconstruction, as discussed by Brau A C et al. in "Accelerated IDEAL Water-Fat Separation Techniques for Single- and Multi-coil Applications" in the 13$^{th}$ Annual International Society of Magnetic Resonance in Medicine Proceedings, 2005, p. 491, which is incorporated by reference for all purposes. This is done by providing $S_1$ as an input to a calibration process 416. The fully sampled echo can act as the sensitivity calibration for parallel imaging reconstruction. Such a parallel imaging reconstruction may be a standard package such as SENSitivity Encoding (SENSE). A commercial implementation of SENSE that is used in this example is Array Spatial Sensitivity Encoding Technique (ASSET) The calibration process is used to provide a first reconstruction 420, a second reconstruction 424, and a third reconstruction 428 for parallel imaging. $S_1$ is passed through the first reconstruction 420, with an acceleration or reduction factor of 1 to provide a combined, low resolution, fully sampled pattern S'$_1$ 432. $S_2$ is passed through the second reconstruction 424, with an acceleration or reduction factor of 2 and then through a spatial low pass filter 426, which provide a low resolution fully sampled pattern S'$_2$ 436. $S_3$ is passed through the third reconstruction 428, with an acceleration or reduction factor of 2 and then through a spatial low pass filter 430, to provide a low resolution fully sampled pattern S'$_3$ 440. After parallel imaging reconstruction and low-pass filtering of the high-resolution echoes, the field map is estimated from all three low-resolution echoes 444, represented by Ψ 448. In this example, IDEAL is used to provide the 3-point field map estimation. Subsequent field map demodulation and fat-water decomposition 452, 456 are performed only on the two high-resolution echoes after parallel imaging reconstruction 424 and 428 by using the field map 448, determined in previous steps. This modification combines the scan time reduction offered by parallel imaging with the scan time reduction offered by reduced sampling for a net scan time reduction greater than either method could achieve alone.

Since the 2⁺ IDEAL decomposition is performed on only two images, the IDEAL reconstruction after the field map demodulation step (452) effectively becomes a 2-pt water-fat separation method, and the IDEAL echo times must therefore be recalculated to optimize the noise performance for this case. Optimal echo spacing can be determined in a manner similar to that described by A. Pineda, S. Reeder, Z. Wen, H. Yu, N. Pelc in "Cramer-Rao Bounds for 3-Point Decomposition of Water and Fat", Magn. Reson. Med. (2005) 54(3):625-635 (hereinafter Pineda et al.), which is incorporated by reference for all purposes.

1⁺ Point Process

In a 1⁺-point reduced sampling IDEAL technique for dynamic imaging acquisitions, as described in H. Yu, S. B. Reeder, C. A. McKenzie et al., in "Single Acquisition Water-Fat Separation: Feasibility Study for Dynamic Imaging", Magn. Reson. Med. (2006) 55(2):413-422, a 3-pt calibration step is first performed to calculate the field map and constant phase map at the beginning of the dynamic study. Then a series of images is acquired with the echo time fixed such that water and fat are in quadrature at the same locations during the dynamic study. The field map and phase map are demodulated from the individual images to obtain a complex image with water and fat signals in the real and imaginary channels, respectively, from which water and fat images can be separated at each time point during the dynamic series. This method is particularly attractive for dynamic contrast-enhanced imaging applications in which high temporal resolution is desired.

Self-calibrated parallel imaging can be integrated into the 1⁺-pt method to achieve even greater scan time reductions. The sensitivity calibration step and the field and phase map calibration step can be performed together in a "shared calibration" scan. In this way, both the calibration scan and the repeated single echo acquisition can be accelerated with self-calibrated parallel imaging.

Figure 6:
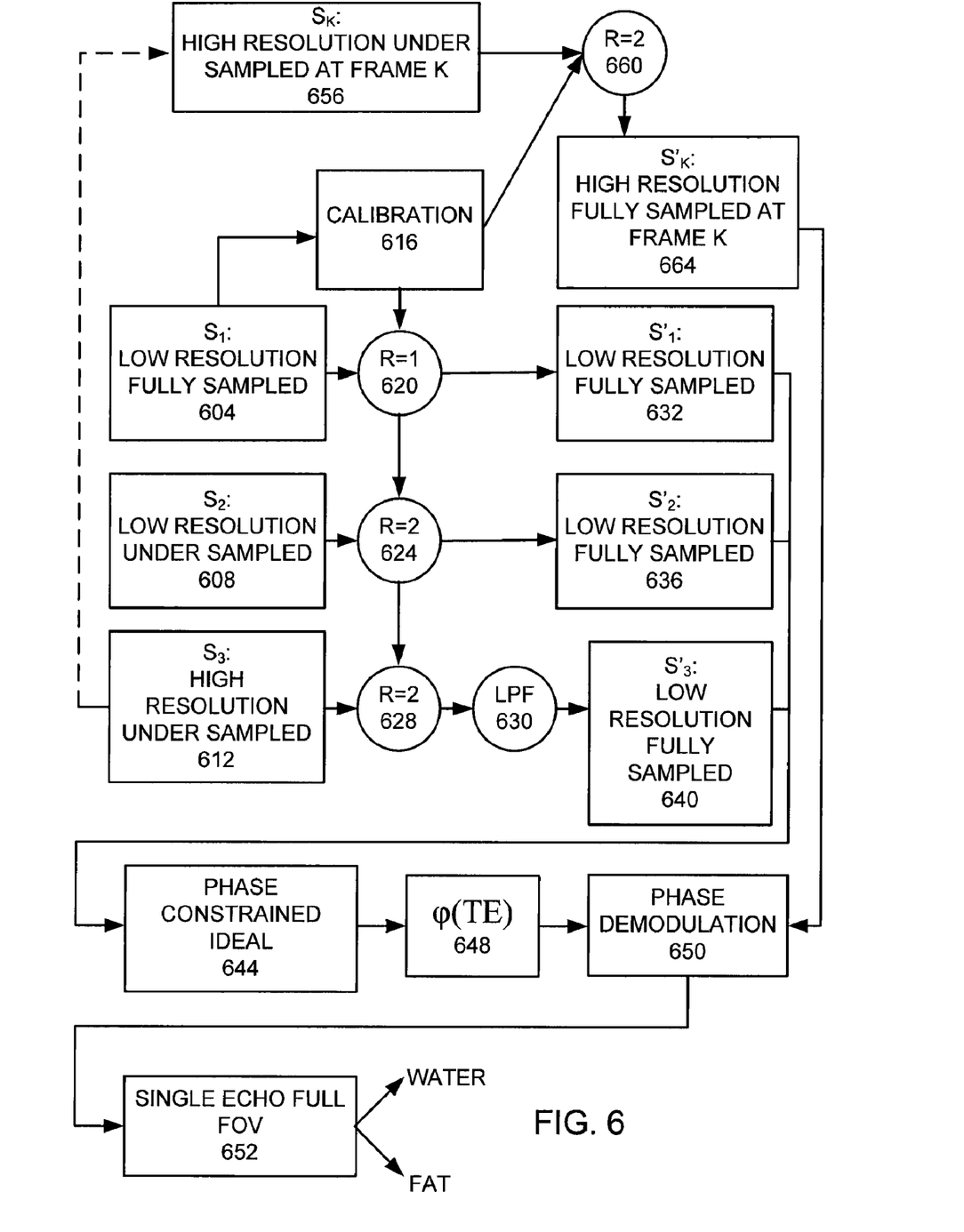
FIG. 6 is a flow chart illustrating a 1+ point example.

FIG. 6 is a flow chart of an example of a 1⁺-point IDEAL technique with self-calibrating parallel imaging. In this example, a low-resolution echo sample pattern $S_1$ 604 is fully sampled. For example, the low resolution $S_1$ has a pattern of 32 lines. Another sampling pattern $S_2$ 608 can be low resolution, under sampled pattern of 16 lines, while a third echo has a sampling pattern $S_3$ 612, which is a high resolution, under sampled sampling pattern of 128 lines. So in this example, $S_2$ and $S_3$ have different sampling patterns.

The fully sampled echo $S_1$ 604 can be used in a self-calibrated manner as the coil sensitivity data needed for parallel imaging reconstruction. This is done by providing $S_1$ as an input to a parallel imaging calibration process 616. The fully sampled echo can act as the sensitivity calibration for parallel imaging reconstruction. The calibration process is used to provide a first reconstruction 620, a second reconstruction 624, and a third reconstruction 628 for parallel imaging. $S_1$ is passed through the first reconstruction 620, with no acceleration (R=1), to provide a low resolution, fully sampled pattern $S'_1$ 632. $S_2$ is passed through the second reconstruction 624, with an acceleration or reduction factor of 2 (R=2), which provide a low resolution fully sampled pattern $S'_2$ 636. $S_3$ is passed through the third reconstruction 628, with an acceleration or reduction factor of 2 (R=2), and a spatial low pass filter to provide a low resolution fully sampled pattern $S'_3$ 640. After parallel imaging reconstruction of the echoes, a phase constrained IDEAL is performed on all three low-resolution echoes 644, to provide a phase map $\phi(TE)$ 648.

At each frame of the subsequent dynamic study (e.g. frame k), a high resolution, under-sampled echo ($S_k$) is acquired 656. The parallel imaging calibration maps, obtained from 616, are used to reconstruction $S_k$ to high resolution, fully-sampled $S_k'$. The field map demodulation and single-echo fat-water decomposition 652 are performed only on the high-resolution fully sampled echo $S_k'$ by using the phase demodulation 650, determined in the previous 3-pt calibration step. This single-echo parallel imaging reconstruction 656, 660, 664, 650 and water-fat decomposition 652 are repeated performed during the dynamic study. This modification combines the scan time reduction offered by parallel imaging with the scan time reduction offered by reduced sampling for a net scan time reduction greater than either method could achieve alone.

Furthermore, the described 1+-point IDEAL for dynamic imaging can be applied in the non-dynamic applications, a process called "1++" pt water-fat separation and described in Yu H, Reeder S, McKenzie C, Shimakawa A, Brau A, Pelc N, Brittain J. Single Quadrature Echo Water-Fat Separation with Robust Phase Correction. Proceedings 13th Scientific Meeting, International Society for Magnetic Resonance in Medicine 2006:2446. The 1++ pt method combines the calibration step and the dynamic imaging step in the 1+ pt method. Like FIG. 6, it acquires only one full-resolution image ($S_3$), with two additional images in low spatial resolution ($S_1$ and $S_2$). After parallel imaging reconstruction with self-calibration, the phase map is estimated from the three low-resolution source images. For the 1++ pt method, $S_3$ and $S_k$ in FIG. 6 become the same image (dashed line). Therefore, single-echo water-fat decomposition can be performed on parallel imaging reconstructed $S_3$ after phase demodulation.

These examples provide a multi echo MRI process, with reduced scan times and provide self-calibration, to reduce errors caused by other calibration processes.

Preferably, Dixon species separation or iterative least-squared decomposition with echo asymmetry and least squares estimation (IDEAL) is used to generate the first species signal and the second species signal. In other embodiments, other processes are used.

In an embodiment of the invention that provides spatial shifting of one of the species signals, the chemical shift between two species may be reduced or eliminated. In another embodiment that provides a recombined in-phase and/or out of phase images, an advantage is provided over the prior art, which provided acquired in-phase and out of phase images, because acquired in-phase and out of phase images have a natural ambiguity when different percentages of two species provide the same output, which is removed in forming the recombined in-phase out of phase images. In addition, acquired in-phase and/or out of phase processes are limited to collecting data only at times when the signals of the species are in-phase and/or out of phase. The embodiments of the invention do not have such time limits and therefore may take an arbitrary number of measurements, thus providing measurements more frequently for faster and/or more accurate image generation because of a resulting signal-to-noise benefit. In addition, the conditioning of each species signal allows for correction of RF coil sensitivities, by providing a normalization of each signal, or the correction of other distortions.

The generation of a first species signal and a second species signal from the same magnetic resonance data is described in U.S. patent application Ser. No. 10/690,230, by Reeder et al. entitled "Magnetic Resonance Imaging of Different Chemical Species in a System Having Magnetic Field Heterogeneities," filed on Oct. 23, 2003, which is incorporated by reference for all purposes.

The recombining and/or the conditioning may perform various operations, such as an arithmetic operation, such as multiplying the signal by a factor or adding two signals together or performing another mathematical operation, such as using a trigonometric function or using a logarithmic function of the signal.

It was demonstrated that the decomposition of water from fat with symmetrically acquired echoes cannot be achieved when the proportions of water and fat within a voxel are approximately equal. A complete characterization of the theoretical maximum noise performance of water-fat decomposition, including the effects of the field inhomogeneities estimation, was reported in A. Pineda, S. Reeder, Z. Wen, H. Yu, N. Pelc in "Cramer-Rao Bounds for 3-Point Decomposition of Water and Fat", Magn. Reson. Med. (2005) 54(3):625-635 (hereinafter Pineda et al.), which is incorporated by reference. This work showed that the theoretical ability of all water-fat separation methods to decompose water from fat in a voxel is dependent on the relative proportions of water and fat, as well as the position of acquired echoes relative to the spin-echo. The dependence on the proportions of water and fat is particularly true for echoes that are acquired symmetrically about the spin-echo. This theory has been extended to spoiled gradient echo imaging (SPGR).

Optimal echo times predicted by Pineda et al. acquire the second of the three echoes in quadrature, re: the phase between the water and fat is such that water and fat are perpendicular to one another, i.e. $\pi/2+\pi k$, k=any integer. The first and third echoes are subsequently acquired $2\pi/3$ before and after the second echo, respectively. Such echo combinations have been shown to provide the optimal noise performance for a fat-water separation acquisition. The use of different k-groups permits great flexibility with pulse sequences such as spoiled gradient echo imaging. This has been found and shown by the inventors to be an effective method at both 1.5 and 3.0 T.

Brau A C, McKenzie C A, Shimakawa A, Yu H, Brittain J H, Reeder S B, in "Accelerated IDEAL Water-Fat Separation Techniques for Single- and Multi-coil Applications" in the 13$^{th}$ Annual International Society of Magnetic Resonance in Medicine Proceedings, 2005, p. 491 described a second reduced data acquisition method, known as '2+'. In the 2+ method, two full resolution images of the 'IDEAL' echo times are acquired and a third lower resolution image is also obtained. Using the central lines of k-space that are common to all three images, three low resolution images are obtained after Fourier transformation. Conventional IDEAL estimation is then performed to obtain a low resolution field map from the three low resolution images. The phase shifts generated by the low resolution field map are subsequently demodulated from the two high resolution complex images, and from these demodulated images, water and fat separation can be performed in the usual manner with the least-squares estimation. In this way, high resolution, high SNR images with robust water-fat separation can be obtained with an approximately 30 percent scan time reduction from conventional 3-point IDEAL water-fat separation. This scan time reduction is obtained without the use of parallel imaging. In the work by Brau et al., parallel accelerations were also applied. In addition, the low resolution image obtained as part of the fat-water separation acquisition was used as a calibration scan to measure coil sensitivity, necessary for parallel imaging accelerations.

U.S. patent application Ser. No. 10/690,230, by Pelc and Reeder, entitled "Magnetic Resonance Imaging of Different Chemical Species in a System Having a Magnetic Field Heterogeneities," filed on Oct. 20, 2003, which is incorporated by reference for all purposes, teaches that using least squares.

The separation of water and fat provides a unique opportunity to recombine images in various combinations that may be helpful for particular diagnostic considerations. For example, with fatty infiltration of the liver or other organs, a "fat fraction image" can be calculated as the proportion of fat signal (fat/(fat+water)) within the liver and may be important to gauge the severity of the disease. In addition, recombined "in-phase" and "out of phase" images calculated as: (abs(water)+abs(fat)) and abs(abs(water)−abs(fat)), respectively, are analogous to in and out of phase imaging that is routinely performed for most MR liver protocols. Other possibilities include a fat:water ratio image (fat/water), and so on.

With separate water and fat images, a variety of new image combinations can be generated. Recombined images can be generated with the simple sum and difference of the calculated water and fat images, analogous to conventional "in-phase" and "out of phase" images that are commonly acquired for adrenal and liver imaging. This is also beneficial to distinguish between benign lesions of the bone from metastases; benign lesions contain fat and show decreased signal with out of phase imaging. Other possible calculated images, such as a "fat fraction" image (i.e.: fat/(water+fat)) or "fat:water ratio" image (i.e.: fat/water) may be beneficial, particularly for quantitative applications such as characterization of hepatic steatosis and microscopic fat seen in adrenal adenomas, and possibly other entities. True quantitative measures of fat content will require knowledge of relaxation parameters within these tissues in order to give absolute measures of fatty infiltration.

Pineda et al. performed a comprehensive noise analysis of three-point water-fat separation methods. This work demonstrated that the theoretical optimal combination of echoes for a three-point fast spin-echo (FSE) acquisition occurred when the phase between water and fat phase was: $-\pi/6$, $\pi/2$, $7\pi/6$. This combination of echoes has been applied to FSE imaging using an iterative least-squares water-fat separation method that allows for arbitrarily and unequally spaced echo shifts. Experimental validation of the noise performance showed that the maximum possible SNR of the FSE water and fat images was achieved. This method has been applied to various FSE applications, including the ankle, brachial plexus and cervical spine, as well as balanced steady-state free precession (SSFP) imaging in the knee and heart.

Validation of the noise behavior for GRE imaging is important because the overall predicted noise behavior for gradient echo imaging is different than either FSE or SSFP imaging. It can be shown that the optimal choice of echoes that maximizes the noise performance of magnitude images leads to lower noise performance for the phase and field map for GRE imaging, compared to FSE or SSFP. This is related to the fact that all echo shifts for GRE imaging must be greater than zero, while echo shifts can be negative for FSE because echoes can be acquired before the refocusing of the spin-echo. This effect also occurs with SSFP, because of the 180° relative phase shift between water and fat at TE=TR/2 for certain choices of TR. Therefore, experimental validation of the noise performance for IDEAL-GRE imaging is necessary in order to show that the optimal noise performance is achievable even in the presence of higher uncertainty in the phase and field maps.

Theory:

Noise Performance

The noise performance of a water-fat decomposition is conveniently described with the effective number of signal averages, or NSA, defined as $$NSA = \frac{\sigma^2}{\sigma_p^2} \quad (1)$$

where $\sigma^2$ is the variance of the noise in a source image and $\sigma_p^2$ is the variance of the noise in a calculated water or fat image. The NSA is a useful measure of the noise performance of a water-fat decomposition, and has an intuitive basis: For any three-point water-fat decomposition method, the maximum possible NSA is three, which is equivalent to what would be obtained if the object contained only water or only fat, and the three source images were averaged. Eq. 1 will be used experimentally to determine the noise performance of the IDEAL-GRE method.

Optimal Echo Shifts

The phase shift between water and fat from an echo acquired at time t relative to TE=0, can be written, $$\theta = 2\pi \Delta f t \quad (2)$$

where $\Delta f$ is the chemical shift between water and fat, (−210 Hz at 1.5 T and −420 Hz at 3.0 T). Phase shifts are more convenient than echo shifts, because they are independent of field strength and are more intuitive, providing more physical meaning to the water-fat separation problem.

As predicted by Pineda et al., one set of optimal echo shifts for the three images occurs when the water-fat phase is, $1^{st}$ echo: $-\pi/6+\pi k$ $2^{nd}$ echo: $\pi/2+\pi k$ $3^{rd}$ echo: $7\pi/6+\pi k$, $k$=any integer     (3)

This echo combination has an intuitive basis as follows. In the "perfect" NMR experiment, there are no constant phase shifts or $B_o$ inhomogeneities, and an image acquired with an echo time that has water and fat in quadrature, i.e.: $\pi/2+\pi k$, can be used to separate water from fat with that single image: water and fat are simply the real and imaginary components of the complex image. However, the presence of unknown constant phase shifts and $B_o$ inhomogeneities requires additional information. The acquisition of two additional images 120°($2\pi/3$) before and after the second echo located at $\pi/2+\pi k$ provides uniform sampling around the unit circle, providing the optimal noise performance in the estimation of water and fat from the three source images. It is important to note, that the center echo must be in quadrature; echo combinations with the first or third echo in quadrature will not have optimum noise performance.

Echo shifts that satisfy Eq. 3 will have optimal noise performance. However, noise performance is poor when the second echo is acquired when water and fat are aligned, i.e.: any multiple of $2\pi$, even if the spacing between all three echoes remains at $2\pi/3$. In this case, the NSA is three when a voxel contains all water, but is significantly reduced for voxels that contain all fat, and has a broad minimum approaching zero for voxels containing mixtures of water and fat in near equal proportions. This echo combination can lead to image artifacts that include irregular margins at the interface between tissues with water signal (e.g. muscle) and fat signal (e.g. subcutaneous fat), as a result of partial volume effects. In addition, areas of the calculated water image that contain mostly fat signal (e.g. bone marrow and subcutaneous fat) appear noisy.

The choice of echo group, determined by the echo group index k, will depend on the minimum TE ($TE_{min}$) of the sequence. Typically, k is chosen to minimize the echo times, but ensure that they are all greater than $TE_{min}$. For example, at 1.5 T one possible echo combination for IDEAL-GRE imaging occurs for k=1, with echo shifts of 2.0 ms, 3.6 ms and 5.2 ms, so long as $TE_{min}$ is 2.0 ms or less. It is worthwhile to note that spacing between echo groups decreases with increasing field strength: the time between consecutive echo groups at 1.5 T is approximately 2.4 ms compared to a spacing of 1.2 ms at 3.0 T. The decrease in time between echo groups and the fact that echoes within a group are more closely spaced with increasing field strength, makes IDEAL more flexible and more efficient for imaging at 3.0 T.

Pulse Sequence and Image Reconstruction

IDEAL uses an iterative least-squares method that is compatible with multi-coil imaging. In this method, an iterative method is used to determine the local field map ($B_o$ inhomogeneity) in the least squares sense. The field map is subsequently demodulated from the signal in the source images. This signal is then decomposed into separate water and fat signals using a least-squares solution matrix inversion. This latter step is similar to a least-squares approach described in L. An, Q. S. Xiang, "Chemical Shift Imaging with Spectrum Modeling", Magn. Reson. Med. (2001) 46(1):126-130 (hereinafter An), which is restricted to equally spaced echo shifts. IDEAL uses a region growing reconstruction algorithm to prevent water-fat "swaps" that can occur from the natural ambiguity between water and fat signals, e.g. for an acquisition at 1.5 T with the center frequency set to water, water that is off-resonance by −210 Hz has similar signal to fat that is on-resonance.

Although in the specification and claims, the echoes are designated as first, second, and third and are shown in some embodiments as a specific order in time, the first, second, and third echoes may occur in various orders in a cycle the specification and claims.

U.S. patent application Ser. No. 11/738,339, by Scott B. Reeder et al., entitled "MRI METHODS FOR COMBINING SEPARATE SPECIES AND QUANTIFYING A SPECIES" filed concurrently herewith, teaches MRI methods for combining separate species and quantifying a species; U.S. patent application Ser. No. 11/738,343, by Angel R. Pineda et al., entitled "MAXIMUM LIKELIHOOD ESTIMATOR IN THE PRESENCE OF NON-IDENTICALLY DISTRIBUTED NOISE FOR DECOMPOSITION OF CHEMICAL SPECIES IN MRI" filed concurrently herewith, teaches maximum likelihood estimator in the presence of non-identically distributed noise for decomposition of chemical species in MRI; U.S. patent application Ser. No. 11/738,345, by Zhifei Wen et al., entitled "REGULARIZED SPECIES SEPARATION" filed concurrently herewith, teaches regularized species separation; U.S. patent application Ser. No. 11/738,347, by Huanzhou Yu et al., entitled "SLIDING WINDOW RECONSTRUCTION AND PHASE/FIELD MAP UPDATING FOR DYNAMIC CHEMICAL SHIFT IMAGING" filed concurrently herewith, teaches sliding window reconstruction and phase/field map updating for dynamic chemical shift imaging; U.S. patent application Ser. No. 11/738,350, by Huanzhou Yu et al., entitled "SIMULTANEOUS CHEMICAL SPECIES SEPARATION AND $T_2$* MEASUREMENT USING MRI" filed concurrently herewith, teaches simultaneous chemical species separation and $T_2$* measurement using MRI; U.S. patent application Ser. No. 11/738,352, by Charles A. McKenzie et al., entitled "CALIBRATION MAPS FOR PARALLEL IMAGING FREE OF CHEMICAL SHIFT ARTIFACT" filed concurrently herewith, teaches calibration maps for parallel imaging free of chemical shift artifact, all of which are incorporated by reference herein.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for generating a self-calibrating parallel multiecho magnetic resonance image, comprising:
   a) applying a magnetic resonance imaging excitation;
   b) acquiring a first echo at a first echo time in a first sampling pattern;
   c) acquiring a second echo at a second echo time different from the first echo in a second sampling pattern different from the first sampling pattern; and
   d) using the acquired first echo and acquired second echo to generate an image in a sampling pattern, wherein none of the acquired echoes for generating the image have the same sampling pattern as the image sampling pattern.

2. The method as recited in claim 1, wherein each sampling pattern of echoes used to generate the image have reduced sampling compared to the image sampling pattern of the generated image.

3. The method, as recited in claim 2, wherein at least one of the first sampling pattern or second sampling pattern is used to calibrate $B_1$ in addition to generating the image.

4. The method, as recited in claim 3, wherein a number of lines of data forming the image sampling pattern is greater than a number of lines of data forming the first sampling pattern and a number of lines of data forming the second sampling pattern.

5. The method, as recited in claim 4, wherein the number of lines forming the first sampling pattern is not equal to the number of lines forming the second sampling pattern.

6. The method, as recited in claim 5, wherein the first echo and the second echo are a result of the same magnetic image excitation.

7. The method, as recited in claim 6, further comprising acquiring a third echo at a third echo time different from the first echo time and the second echo time in a third sampling pattern different from the first sampling pattern, the second sampling pattern, and the image sampling pattern, wherein the image is also generated from the third echo.

8. The method, as recited in claim 1, wherein the first sampling pattern is a low resolution pattern, and wherein the second sampling pattern is a high resolution under sampled pattern, and wherein the image sampling pattern is a high resolution fully sampled pattern, wherein the first sampling pattern is used for calibration.

9. The method, as recited in claim 8, further comprising acquiring a third echo at a third echo time different from the first echo time in a third sampling pattern, which is an under sampled pattern.

10. The method, as recited in claim 9, wherein step d comprises using the calibration to the acquired second echo and acquired third echo to transform the second sampling pattern to a low resolution fully sampled transformed second sampling pattern and to transform the third sampling pattern to a low resolution fully sampled third sampling pattern.

11. The method, as recited in claim 10, wherein step d further comprises:
using the calibration to transform the first sampling pattern to a transformed first sampling pattern;
using the transformed first sampling pattern, the low resolution fully sampled transformed second sampling pattern, and the low resolution fully sampled transformed third sampling pattern to provide a 3 point field map estimation;
providing a field map demodulation from the 3 point field map estimation; and
providing a species separation from the field map demodulation.

12. The method, as recited in claim 1, wherein the first echo and the second echo are a result of the same magnetic image excitation.

13. The method, as recited in claim 1, further comprising acquiring a third echo at a third echo time different from the first echo time and the second echo time in a third sampling pattern different from the first sampling pattern, the second sampling pattern, and the image sampling pattern, wherein the image is also generated from the third echo.

14. The method, as recited in claim 1, further comprising:
acquiring a third echo at a third echo time different from the first echo time and the second echo time, wherein a phase map is generated using the first echo, the second echo, and the third echo; and
providing a dynamic image, using at least one cycle, wherein each cycle comprises:
applying a magnetic resonance image:
acquiring a single echo at an echo time in a third sampling pattern; and
using the phase demodulation and the single echo to create an image of the dynamic image.

15. The method, as recited in claim 14, wherein the first sampling pattern is a low resolution pattern fully sampled pattern, wherein the second sampling pattern is a low resolution under sampled pattern, wherein the third sampling pattern is a high resolution under sampled pattern, wherein the image sampling pattern is a high resolution fully sampled pattern, and wherein the first sampling pattern is used for calibration.

16. The method, as recited in claim 1, further comprising:
acquiring a third echo at a third echo time different from the first echo time and the second echo time in a third sampling pattern different from the first sampling pattern and the image sampling pattern, wherein the image is also generated from the third echo, using the first sampling pattern, the second sampling pattern, and the third sampling pattern to provide a phase demodulation; and
using the phase demodulation and the third echo to create an image.

17. The method, as recited in claim 16, wherein the first sampling pattern is a low resolution pattern fully sampled pattern, wherein the second sampling pattern is a low resolution under sampled pattern, wherein the third sampling pattern is a high resolution under sampled pattern, wherein the image sampling pattern is a high resolution fully sampled pattern, and wherein the first sampling pattern is used for calibration.

18. A method for generating a dynamic image comprising a plurality of self-calibrating parallel multiecho magnetic resonance images, comprising:
providing a phase demodulation and an image, comprising:
applying a magnetic resonance imaging excitation through the magnet system;
acquiring a first echo at a first echo time in a first sampling pattern;
acquiring a second echo at a second echo time different from the first echo in a second sampling pattern different from the first sampling pattern;
acquiring a third echo at a third echo time different from the first echo time and the second echo time in a third sampling pattern; and
using the acquired first echo, the acquired second echo, and the acquired third echo to provide a phase demodulation; and
for a plurality of cycles, where each cycle comprises:
acquiring a single echo in the third sampling pattern; and
using the acquired single echo and the phase demodulation to generate an image, wherein the third sampling pattern is different from the image sampling pattern.

19. The method, as recited in claim 18, wherein the first sampling pattern is a low resolution pattern fully sampled pattern, wherein the second sampling pattern is a low resolution under sampled pattern, wherein the third sampling pattern is a high resolution under sampled pattern, wherein the image sampling pattern is a high resolution fully sampled pattern, and wherein the first sampling pattern is used for calibration.

20. An apparatus for providing magnetic resonance images, comprising:
a magnet system;
a controller electrically connected to the magnet system, comprising:
a display;
at least one processor; and
computer readable media, comprising:
computer readable code for applying a magnetic resonance imaging excitation;
computer readable code for acquiring a first echo at a first echo time in a first sampling pattern;
computer readable code for acquiring a second echo at a second echo time different from the first echo in a second sampling pattern different from the first sampling pattern; and
computer readable code for using the acquired first echo and acquired second echo to generate an image in a sampling pattern, wherein none of the acquired echoes for generating the image have the same sampling pattern as the image sampling pattern, which is displayed on the display.

* * * * *